United States Patent
Lin et al.

(10) Patent No.: US 8,331,460 B2
(45) Date of Patent: Dec. 11, 2012

(54) VIDEO SINK DEVICE

(75) Inventors: Tzuo-Bo Lin, Taipei (TW); Wen-Hsia Kung, Tao Yuan County (TW); Hsien-Chun Chang, Chieh Lung (TW)

(73) Assignee: Realtek Semiconductor Corp., Hsinchu (TW)

( * ) Notice: Subject to any disclaimer, the term of this patent is extended or adjusted under 35 U.S.C. 154(b) by 1265 days.

(21) Appl. No.: 12/109,868

(22) Filed: Apr. 25, 2008

(65) Prior Publication Data

US 2008/0266454 A1    Oct. 30, 2008

(30) Foreign Application Priority Data

Apr. 27, 2007   (TW) .............................. 96114907 A

(51) Int. Cl.
*H04N 7/12*   (2006.01)
*H04N 11/02*   (2006.01)
*H04N 11/04*   (2006.01)

(52) U.S. Cl. .................. 375/240.28; 348/500; 348/511; 348/536; 348/545; 348/547

(58) Field of Classification Search .................. 348/536, 348/547, 511, 545, 548, 500–551; 375/240.28, 375/240.08; 341/155; 347/116; 345/671, 345/501

See application file for complete search history.

(56) References Cited

U.S. PATENT DOCUMENTS

| | | | | | |
|---|---|---|---|---|---|
| 4,607,283 | A | * | 8/1986 | Srivastava et al. | 348/511 |
| 5,703,618 | A | * | 12/1997 | Eglit | 345/671 |
| 2003/0025778 | A1 | * | 2/2003 | Benear et al. | 347/116 |
| 2003/0052997 | A1 | * | 3/2003 | Renner et al. | 348/536 |
| 2006/0017600 | A1 | * | 1/2006 | Ho et al. | 341/155 |
| 2007/0160139 | A1 | * | 7/2007 | Vasquez et al. | 375/240.08 |
| 2007/0291856 | A1 | * | 12/2007 | Fastert et al. | 375/240.28 |

* cited by examiner

*Primary Examiner* — Sath V Perungavoor
*Assistant Examiner* — Nathnael Aynalem
(74) *Attorney, Agent, or Firm* — Muncy, Geissler, Olds & Lowe, PLLC

(57) ABSTRACT

The invention discloses a sink device. The sink device comprises a buffering unit and a clock generating unit. The buffering unit receives a decoding data according to a symbol clock signal, reads the decoding data according to a pixel clock signal, and generates a water level value. The clock generating unit receives the symbol clock signal to generate the pixel clock signal and adjusts a rate of the pixel clock signal according to the water level value and/or a phase difference signal.

16 Claims, 11 Drawing Sheets

US 8,331,460 B2

VIDEO SINK DEVICE

BACKGROUND OF THE INVENTION (a) Field of the Invention

The invention relates to video interface technology, particularly to a sink device applied in the DisplayPort interface.

(b) Description of the Related Art

FIG. 1 shows a schematic diagram illustrating a DisplayPort interface coupling a source device and a sink device, and the data flow between the interfaces.

DisplayPort is a new generation digital high-speed audio-video transmission interface promoted by the Video Electronics Standard Association (VESA). DisplayPort utilizes the PCI-EXPRESS Like Link approach to carry the image and audio data on the high-speed symbol clock signal and the receiving end can recover the original image transmission rate and the original audio transmission rate by transmitting a specific frequency ratio packet.

As shown in FIG. 1A, the DisplayPort interface 130 comprises a main link, an auxiliary channel, and a hot plug detect (HPD) signal wire. The auxiliary channel, with low delay (no more than 500 μs) and capable of bi-directional transmission, provides transmission bandwidth (approximately 1 Mbps) to manage the main link and controls the source device 110 and the sink device 120. The sink device 120 can issue interrupt request to the source device 110 through the BPD signal wire.

The main link is a high bandwidth, low delay, uni-directional isochronous streaming transmission interface comprised by one to four data transmission lanes, to provide digital video and audio simultaneous streaming transmission. Each data transmission lane supports two link rates $F_{link}$: 1.62 Gbps or 2.7 Gbps. Therefore, the transmission rate of the DisplayPort can be up to 10.8 Gbps. It should be noted that, based on the technical content disclosed in the invention, the above-mentioned link rate $F_{link}$ should be differenciated from the other two transmission rates, link symbol rate $F_{sym}$ and pixel rate $F_{pix}$. The link symbol rate $F_{sym}$ indicates the transmission rate of each symbol on the main link. For each data transmission lane, as one symbol generally transmits eight bits, only a portion of the data of a pixel can be transmitted by one symbol, such as the red (R) data in red/green/blue (RGB). In practice, the link symbol rate $F_{sym}$ is generated by having the link symbol rate $F_{sym}$ e $\frac{1}{10}^{th}$ of the link rate $F_{link}$ and thus has two transmission rates, 162 Mbps or 270 Mbps. For the pixel rate $F_{pix}$, it indicates the transmission speed of each pixel generated by the source device 110, and is not related to the link symbol rate $F_{sym}$ and the link rate $F_{pix}$. Besides, the pixel rate $F_{pix}$, the link symbol rate $F_{sym}$ and the link rate $F_{link}$ are mutually independent.

There is no independent clock signal lane in the DisplayPort. The sink device 120 utilizes data recovery technology to recover the link symbol rate $F_{sym}$ from the received data streaming. Besides, when the source device 110 utilizes the DisplayPort to transmit data, the pixel rate $F_{pix}$ to generate the pixel data is independent of the link rate $F_{link}$. The source device 110 transmits data on the interface with the link rate $F_{link}$. The source device 110 transmits time stamps $M_{vid}$ [23:0], $N_{vid}$ [23:0] to the sink device 120 by way of the specific frequency ratio packet of the DisplayPort or the stream attribute packet (actually, the frequency ratio packet of the DisplayPort also comprises audio time stamps $M_{aud}$ and $N_{aud}$ and since the processing method is similar to that of the time stamp, further details will not be repeated herein), for the sink device 120 to recover the pixel clock signal $CLK_{pix}$ (having the pixel rate $F_{pix}$). In other words, the sink device 120 can recover the pixel clock signal $CLK_{pix}$ or the pixel rate $F_{pix}$ utilized by the transmit device 110, according to the symbol clock signal $CLK_{sym}$ (having the link symbol rate $F_{sym}$), the time stamp ratio $M_{vid}/N_{vid}$, and the circuit configuration, as shown in FIG. 1B, comprising two frequency dividers 210, 230 and a phase-locked loop (PLL) 220 which comprises a phase frequency detector PFD, a low pass filter LPF, and a voltage-controlled oscillator VCO. That is, there is no relation between the pixel clock signal $CLK_{pix}$ and the symbol clock signal $CLK_{sym}$ generated by the source device 110. The conversion or mapping between these two transmission rates or clock signals is defined by the time stamps $M_{vid}$, $N_{vid}$, and the mathematical relationship is expressed by: $T_{pix} \times M_{vid} = T_{sym} \times N_{vid}$, and the pixel rate $F_{pix}$ can be $(M_{vid}/N_{vid}) \times F_{sym}$.

FIG. 2A shows a schematic diagram illustrating the related image attribute parameters of a display frame. FIG. 2B shows a timing diagram illustrating the relationship between the vertical synchronizing signal VS, the horizontal synchronizing signal HS and the data enable signal DE. The main stream attribute packet transmitted by the source device 110 further comprises the following image attribute parameters (Please refer to FIG. 2A): frame width $H_{total}$, frame height $V_{total}$, left blank width $H_{start}$, top blanking height $V_{start}$, active area width $H_{width}$, active area height $V_{height}$, vertical synchronizing width $W_{VS}$, horizontal synchronizing width $W_{HS}$, and so forth, for the sink device 120 to recover the original frame format, that is, the size and relative position of the active area A and blank (or non-active) area B of a frame.

According to the DisplayPort specification, the sink device 120 utilizes the above-mentioned recovered pixel rate $F_{pix}$ as the sampling frequency for transmitting the video data to the back-end circuit, and subsequently constructs or recovers the image control signal according to the above-mentioned image attribute parameters. Referring to FIG. 2B, at first the pixel period $T_{pix}$ and the vertical synchronizing width $W_{VS}$ (the line period is used as the counting unit) are used to construct a vertical synchronizing signal VS, then the horizontal synchronizing signal HS is constructed according to the pixel period $T_{pix}$, the frame width $H_{total}$, and the horizontal synchronizing width $W_{HS}$ (the pixel period is used as the counting unit), and finally the data enable signal DE and the field signal FIELD (not shown in the figure), and so forth are constructed according to the pixel period $T_{pix}$, the left blank width $H_{start}$, and the active area width $H_{width}$, so that the video data can be further processed.

However, some environment factors result in deviations of the pixel clock signal $CLK_{pix}$ recovered by the sink device 120. For example, when the frequency of the recovered pixel clock signal $CLK_{pix}$ is different from the frequency of the original pixel clock signal $CLK_{pix}$ of the original source device 110, frequency drift phenomenon occurs. For example, as the number of bits of the time stamps $M_{vid}$, $N_{vid}$ (or $M_{aud}$, $N_{aud}$) are far larger than that of the frequency dividers 210, 230 (approximately more than $2^8$), the two divide-by-M and divide-by-N signals inputted to the phase frequency detector PFD, after frequency dividing, to be generated only once over a long period of time, cause the jitter phenomenon in the output of the phase-locked loop 220 of a common sink device 120, and to thereby result in the above-mentioned frequency drift phenomenon. In order to reduce the electromagnetic interference (EMI), the DisplayPort specification supports frequency spreading designs. However, because of such design, $M_{vid}$ or $M_{aud}$ received by the sink device 120 may have a large offset value. Then, it is easy for the above-mentioned frequency drift phenomenon to happen in the pixel clock signal $CLK_{pix}$ recovered by the sink device 120 according to such offset value. The final image format recovered by the sink device 120 will be different from the image format transmitted by the source device 110 due to the deviation problem of the pixel clock signal $CLK_{pix}$, resulting in abnormal operations in the back-end circuit (devices such as image scaler, display device, and so forth).

BRIEF SUMMARY OF THE INVENTION

In light of the above-mentioned problems, one object of the invention is to provide a sink device that can automatically correct the frequency drift phenomenon when the frequency of the pixel clock drifts, stabilize the pixel clock rate, and achieve the functionality of providing image format recovered by the sink device consistent with the image format transmitted by the source device.

In order to achieve the above-mentioned objects, one embodiment according to the invention provides a sink device comprising a buffering unit and a clock generating unit. The buffering unit is used for temporarily storing a decoding data, receiving the decoding data according to a symbol clock signal, reading the decoding data according to a pixel clock signal, and generating a water level value. The clock generating unit receives the symbol clock signal to generate the pixel clock signal and adjusts a rate of the pixel clock signal according to the water level value.

In addition, one embodiment according to the invention provides a clock signal rate calibrating method, comprising the following steps: at first, receiving a decoding data according to a symbol clock signal, reading a decoding data according to a pixel clock signal, and generating a water level value. Then, the symbol clock signal is received to generate the pixel clock signal and a rate of the pixel clock signal is adjusted according to the water level value.

The sink device and the clock signal rate calibrating method according to one embodiment of the invention determine the current status of the pixel clock signal by the level of the decoding data and/or the other data to thereby adjust the pixel clock signal correspondingly so as to achieve the effect of stabilizing the rate of the pixel clock signal.

The above-mentioned and other objects of the invention and advantages thereof will be described in details by the following drawings, detail description of embodiments, and claims.

DETAILED DESCRIPTION OF THE INVENTION

Although the following description uses the image data transmission of the DisplayPort as an example, the technique of the invention is not limited by such example and can be applied to the transmission of audio data or other data formats of the DisplayPort.

Figure 1A:
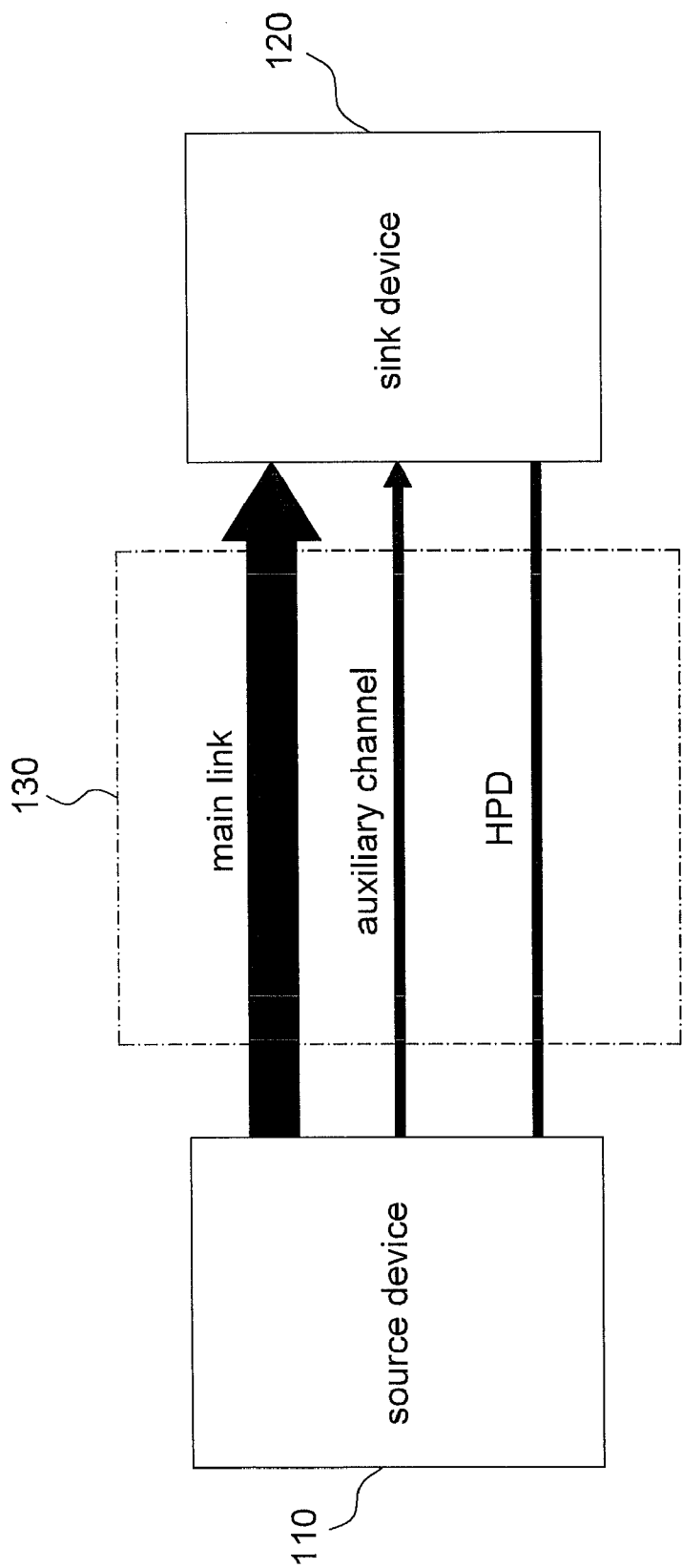
FIG. 1A shows a schematic diagram illustrating an interface, according to the DisplayPort specification, coupling a source device and a sink device, and the data flow between the interfaces.
Figure 1B:
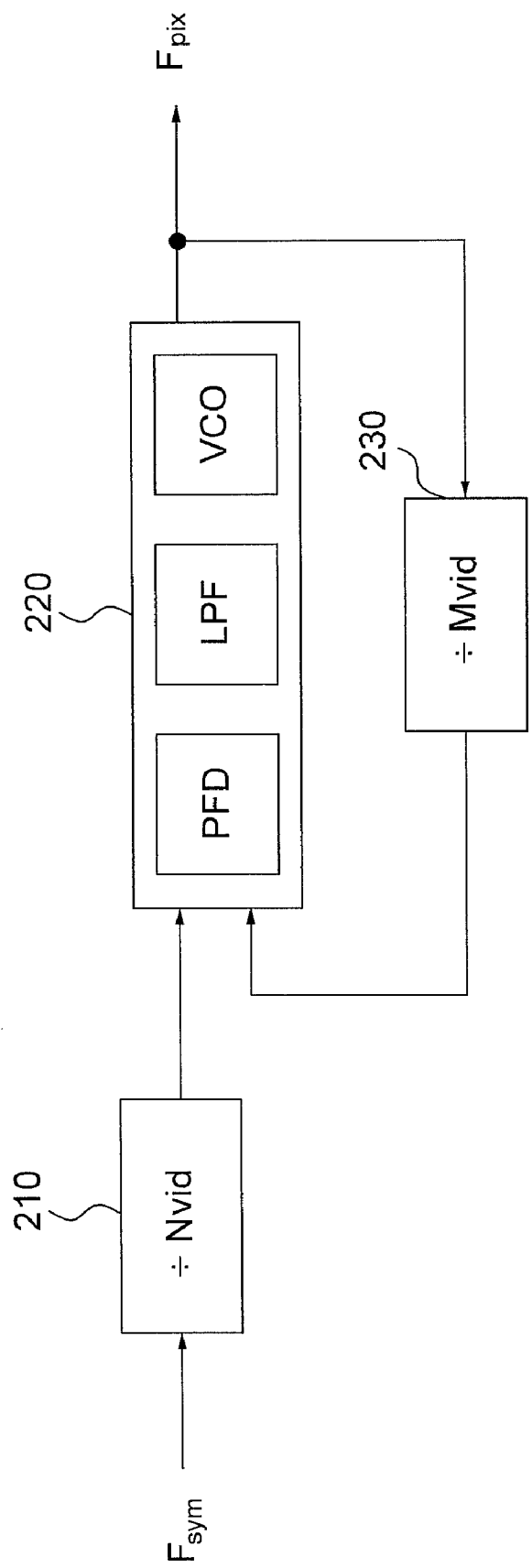
FIG. 1B shows the utilization of a phase-locked loop of a traditional Displayport sink device to couple two frequency dividers for recovering the pixel rate $F_{pix}$ from the link symbol rate $F_{sym}$.
Figure 2A:
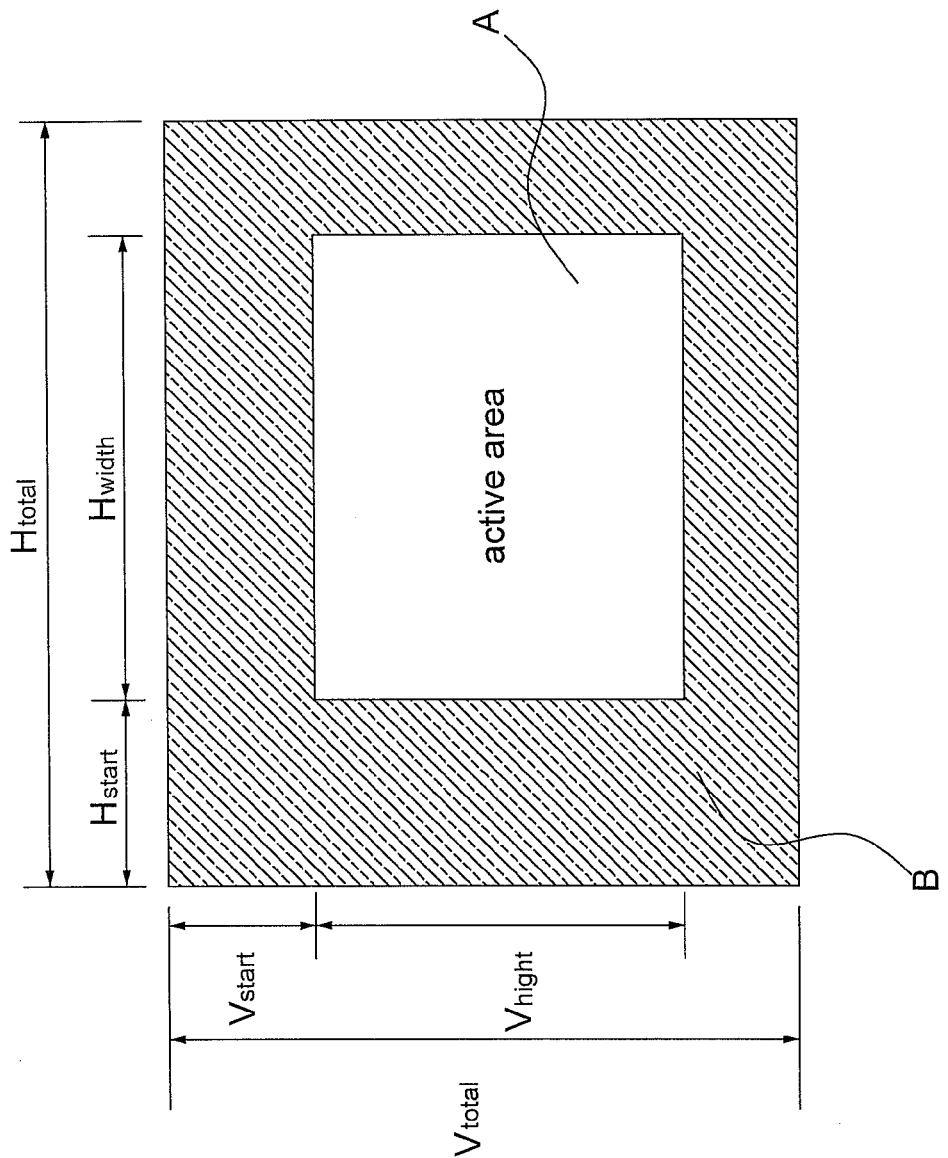
FIG. 2A shows a schematic diagram illustrating the related image attribute parameters of a display frame.
Figure 2B:
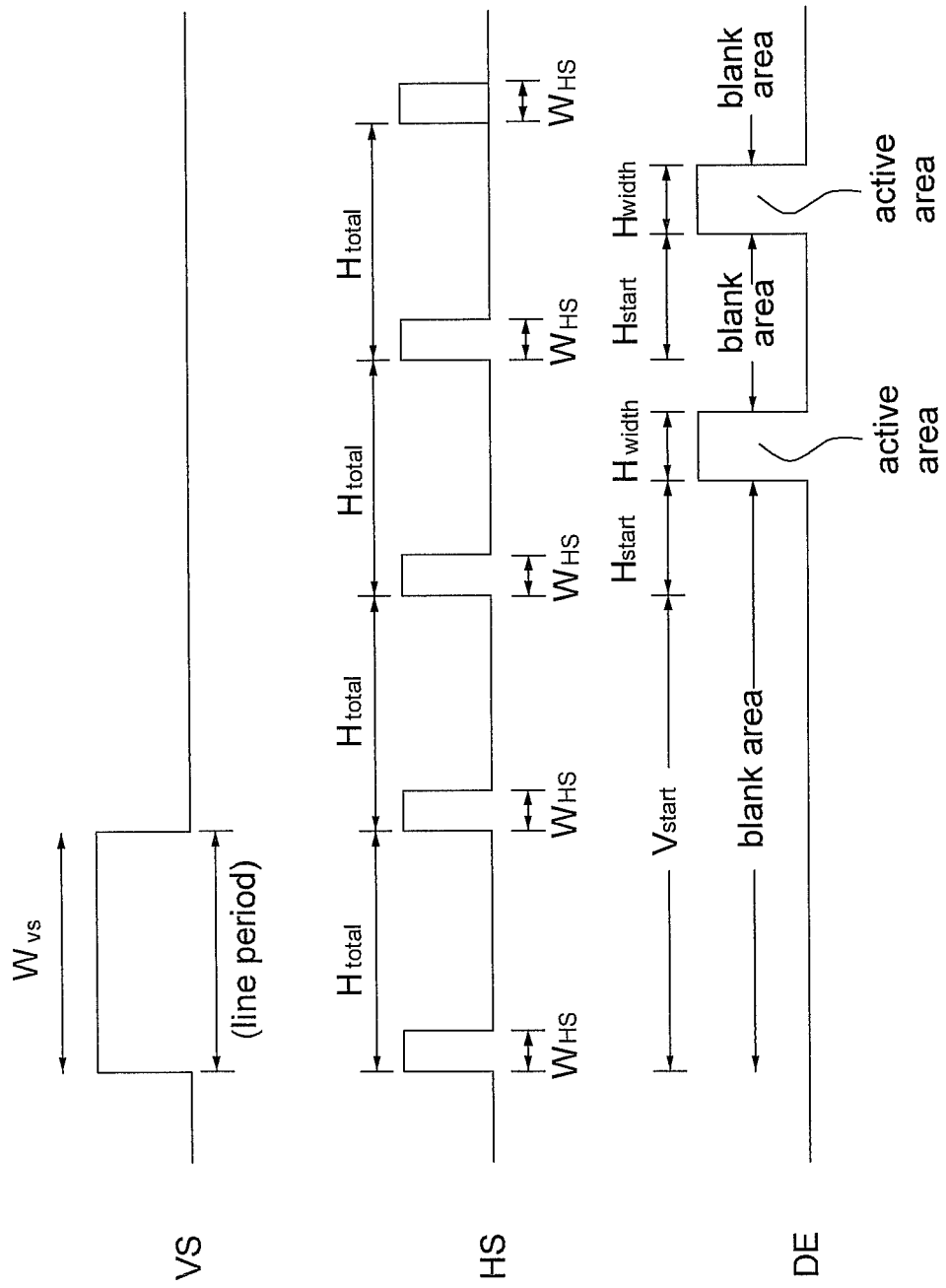
FIG. 2B shows a timing diagram illustrating the relationship between the vertical synchronizing signal VS, the horizontal synchronizing signal HS and the data enable signal DE.
Figure 3A:
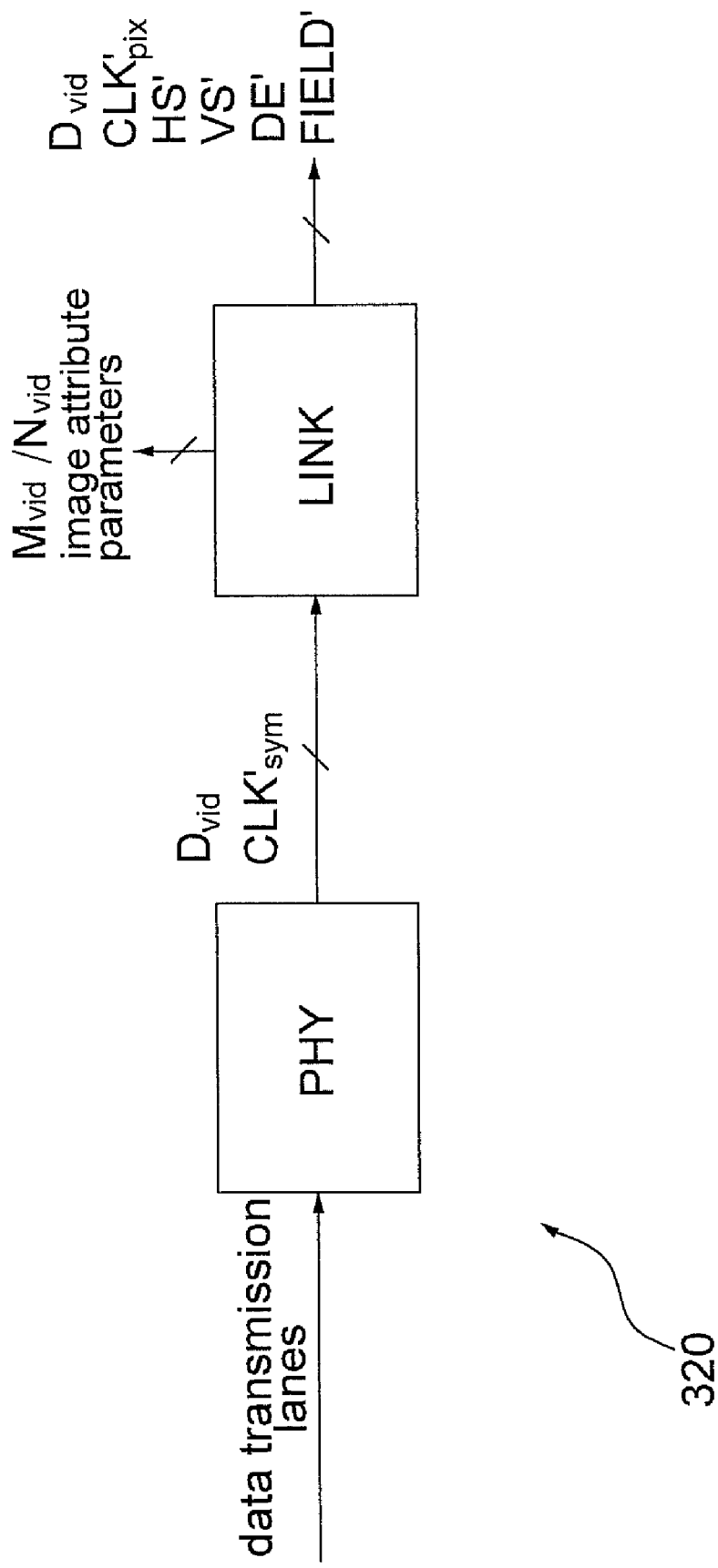
FIG. 3A shows a schematic diagram illustrating a sink device.

FIG. 3A shows a schematic diagram illustrating the functional block of a sink device according to the invention. The sink device 320 comprises a physical layer PHY and a link layer LINK.

The physical layer PHY utilizes a clock data recovery (CDR) circuit (not shown in the figure) to couple to one of the data transmission lanes of the main link, for recovering the symbol clock signal $CLK'_{sym}$ (which may be slightly different from the actual symbol clock signal $CLK_{sym}$ of the source device 110) from the received image data and correctly receives the video data $D_{sym}$ at the same time. Then, a decoder (not shown in the figure) is utilized to decode the video data $D_{sym}$ according to the symbol clock signal $CLK'_{sym}$ (such as using the ANSI8B/10B encoding rule to decode) to generate the video decoding data $D_{vid}$.

The link layer LINK extracts the time stamp $M_{vid}/N_{vid}$ and the related image attribute parameters of the stream attribute packet, such as: $W_{VS}$, $W_{HS}$, $H_{total}$, $V_{total}$, $H_{start}$, $V_{start}$, $H_{width}$, $V_{height}$, VB_ID, BS/BE, VBS, and so forth, and generates the pixel clock signal $CLK'_{pix}$, the horizontal synchronizing signal HS', the vertical synchronizing signal VS', the data enable signal DE', and the field signal FIELD' according to the video decoding data Did and the symbol clock signal $CLK'_{sym}$.

Figure 3B:
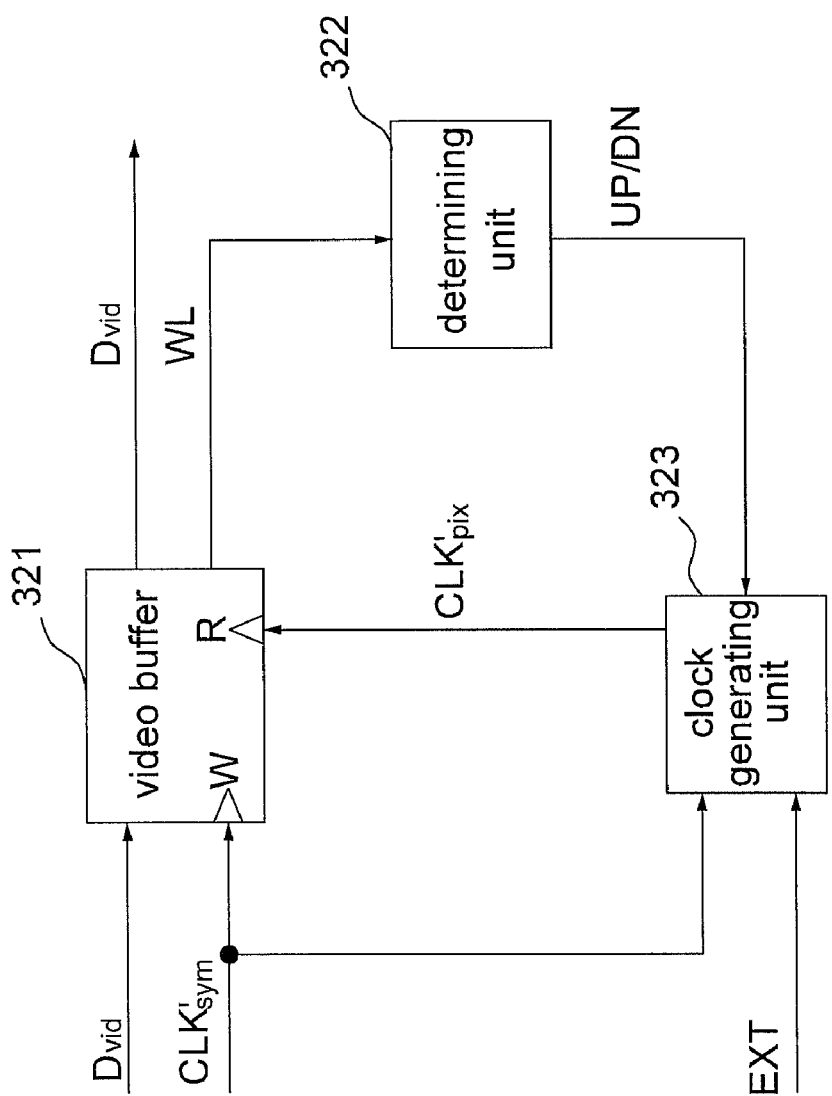
FIG. 3B shows a schematic diagram illustrating the partial structure and partial data flow of a sink device according to one embodiment of the invention.

FIG. 3B shows a schematic diagram illustrating the partial data flow and the structure of a sink device 320 according to one embodiment of the invention. Part of the structure of the link layer LINK comprises a video buffer 321, a determining unit 322, and a clock generating unit 323.

In one embodiment of the invention, the video buffer 321 is a FIFO memory for receiving and temporarily storing the video decoding data $D_{vid}$ according to the symbol clock signal $CLK'_{sym}$. Then, when the video buffer 321 outputs the video decoding data $D_{vid}$, in order to make sure that the back-end circuits can function normally, the video decoding data $D_{vid}$ is read according to the pixel clock signal $CLK'_{pix}$ (having the pixel rate $F'_{pix}$). The purpose of utilizing the video buffer 321 is to buffer the cumulated data flow caused by the transmission rate difference between the symbol clock signal $CLK'_{sym}$ and the pixel clock signal $CLK'_{pix}$. That is, the video buffer 321 is used to perform frequency converting operations. When frequency converting reaches balance, that is, the original pixel clock signal $CLK_{pix}$ transmitted by the source device 110 is same as the pixel clock signal $CLK'_{pix}$ recovered by the sink device 320, the average data volume written-in and read-out by the video buffer 321 per unit time is the same. However, when the output jittering of the phase-locked loop 220 in the prior art or other environmental factors cause the frequency of the recovered pixel clock signal $CLK'_{pix}$ of the sink device 320 to drift and have $CLK'_{pix}$ be different from the original pixel clock signal $CLK_{pix}$, the average data volume written-in and read-out by the video buffer 321 per unit time varies to rise or lower the water level value of the temporarily stored data. The video buffer 321 generates a water level value WL according to the flow volume or the total volume of the temporarily stored video decoding data $D_{vid}$. For example, the video buffer 321 can generate the water level value WL by subtracting a write address of the video decoding data $D_{vid}$ by a read address of the video decoding data $D_{vid}$.

The determining unit 322 generates a control signal UP/DN according to the level value WL to control the rate of generating the pixel clock signal $CLK'_{pix}$ by the clock generating unit 323. The control signal UP controls the clock generating unit 323 to increase a rate of the pixel clock signal $CLK'_{pix}$. The control signal DN controls the clock generating unit 323 to decrease a rate of the pixel clock signal $CLK'_{pix}$. The clock generating unit 323 receives the symbol clock signal $CLK'_{sym}$ or external clock EXT to generate the above-mentioned pixel clock signal $CLK'_{pix}$ and adjusts a rate of the pixel clock signal $CLK'_{pix}$ according to the control signal UP/DN.

For example, when the time stamp $M_{vid}$ or $N_{vid}$ received by the sink device 320 has a larger offset value, or other environmental factors cause the pixel clock signal $CLK'_{pix}$ recovered by the clock generating unit 323 to have errors or jitters to have the data write-in speed faster and increase the temporarily stored data volume (the water level) in the video buffer 321, the determining unit 322 then generates a control signal UP according to the increase of the water level value WL so as to have the clock generating unit 323 increase a rate of the pixel clock signal $CLK'_{pix}$ to increase the read-out rate of the video decoding data $D_{vid}$, and reduce the level. On the contrary, when the data read-out rate increases, resulting in the decrease of the temporarily stored data volume (the water level) in the video buffer 321, the determining unit 322 generates a control signal DN according to the decrease of the water level value WL, to have the clock generating unit 323 decrease a rate of the pixel clock signal $CLK'_{pix}$ to decrease the read-out rate of the video decoding data $D_{vid}$ and increase the water level. Or, when the temporarily stored data volume (the water level) in the video buffer 321 is "FULL" or "ALMOST FULL", the determining unit 322 can generate a control signal UP according to the upper limit of the water level value WL to have the clock generating unit 323 increase a rate of the pixel clock signal $CLK'_{pix}$ to increase the read-out rate of the video decoding data $D_{vid}$ and decrease the level. Or, when the temporarily stored data volume (the water level) in the video buffer 321 is "EMPTY" or "ALMOST EMPTY", the determining uni 322 can generate a control signal DN according to the lower limit of the water level value WL to have the clock generating unit 323 decrease a rate of the pixel clock signal $CLK'_{pix}$ to decrease the read-out rate of the video decoding data $D_{vid}$ and increase the level.

In conclusion, the sink device 320 according to the invention not only utilizes the time stamp $M_{vid}/N_{vid}$ but also utilizes real time level monitoring mechanism of the video buffer 321 to stabilize the data read-write rate when errors happen in the pixel clock signal $CLK'_{pix}$. The pixel clock signal $CLK'_{pix}$ recovered by the sink device 320 can be the same as the original pixel clock signal $CLK_{pix}$ transmitted by the source device 110. The sink device 320 is not influenced by the offset of the $M_{vid}$ or $M_{aud}$ or the interferences of the other environmental factors to have the image format recovered by the sink device 320 be the same as the image format transmitted by the source device 110 so as to have the back-end circuit function normally and resolve the problems in the prior art.

Figure 3C:
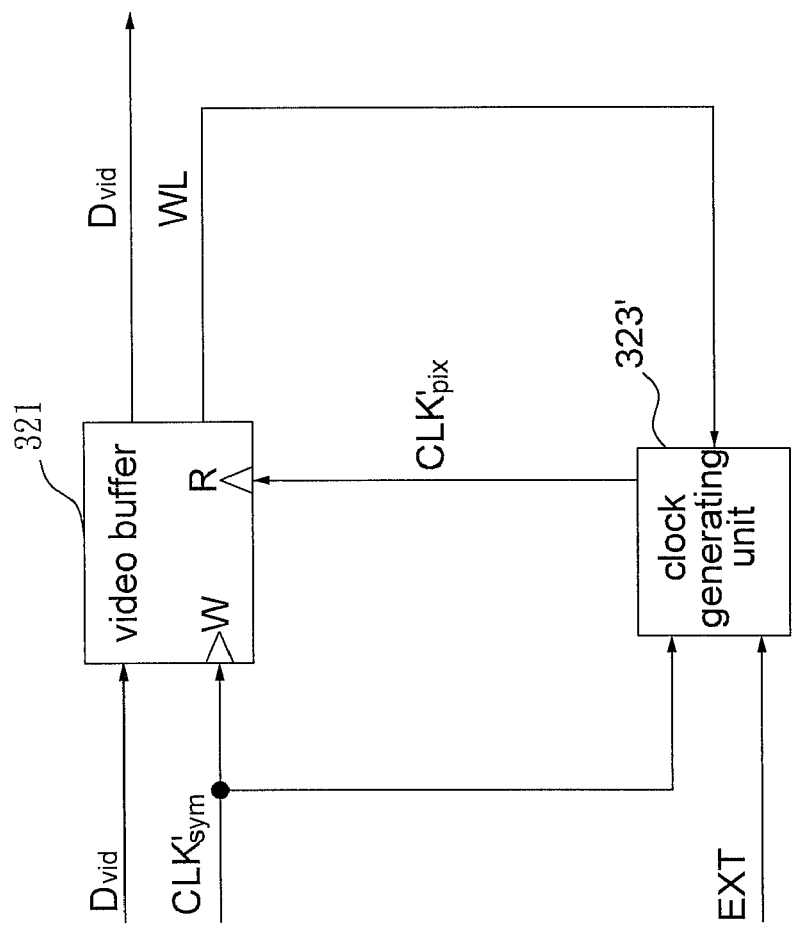
FIG. 3C shows a schematic diagram illustrating the partial structure and partial data flow of a sink device according to another embodiment of the invention.

It should be noted that in other embodiment of the invention the designer can also integrate the function of the determining unit 322 into the clock generating unit 323' if necessary, as shown in FIG. 3C. That is, the clock generating unit 323' can adjust a rate of the pixel clock signal $CLK'_{pix}$ directly according to the water level value WL.

Figure 4A:
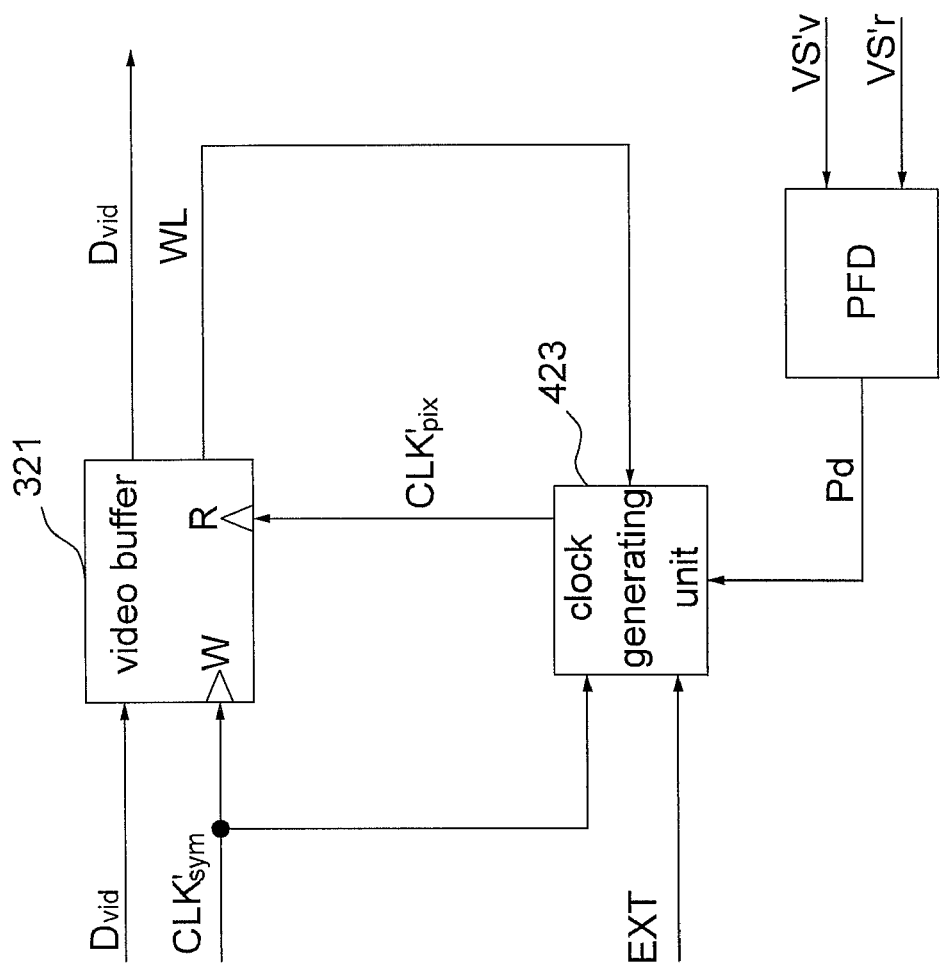
FIG. 4A shows a schematic diagram illustrating the partial structure and partial data flow of a sink device according to yet another embodiment of the invention.

FIG. 4A shows a schematic diagram illustrating the partial data flow and structure of the link layer LINK of the sink device 320 according to another embodiment of the invention. Part of the structure of the link layer LINK comprises a video buffer 321, a clock generating unit 423, and a phase frequency detector PFD. The concept of the embodiment is similar to the structure of the FIGS. 3B and 3C. The time stamp $M_{vid}/N_{vid}$ is used as the reference while recovering the pixel clock signal $CLK'_{pix}$. Besides, the pixel clock signal $CLK'_{pix}$ is recovered according to other data as well. It should be noted that the embodiment also utilizes other measuring mechanism to calculate the pixel clock signal $CLK'_{pix}$ and then utilizes the symbol clock signal $CLK'_{sym}$ or the external clock EXT together with the clock generating unit 423 to accurately recover the pixel clock signal $CLK'_{pix}$. The details of the embodiment will be described in the following.

Figure 4B:
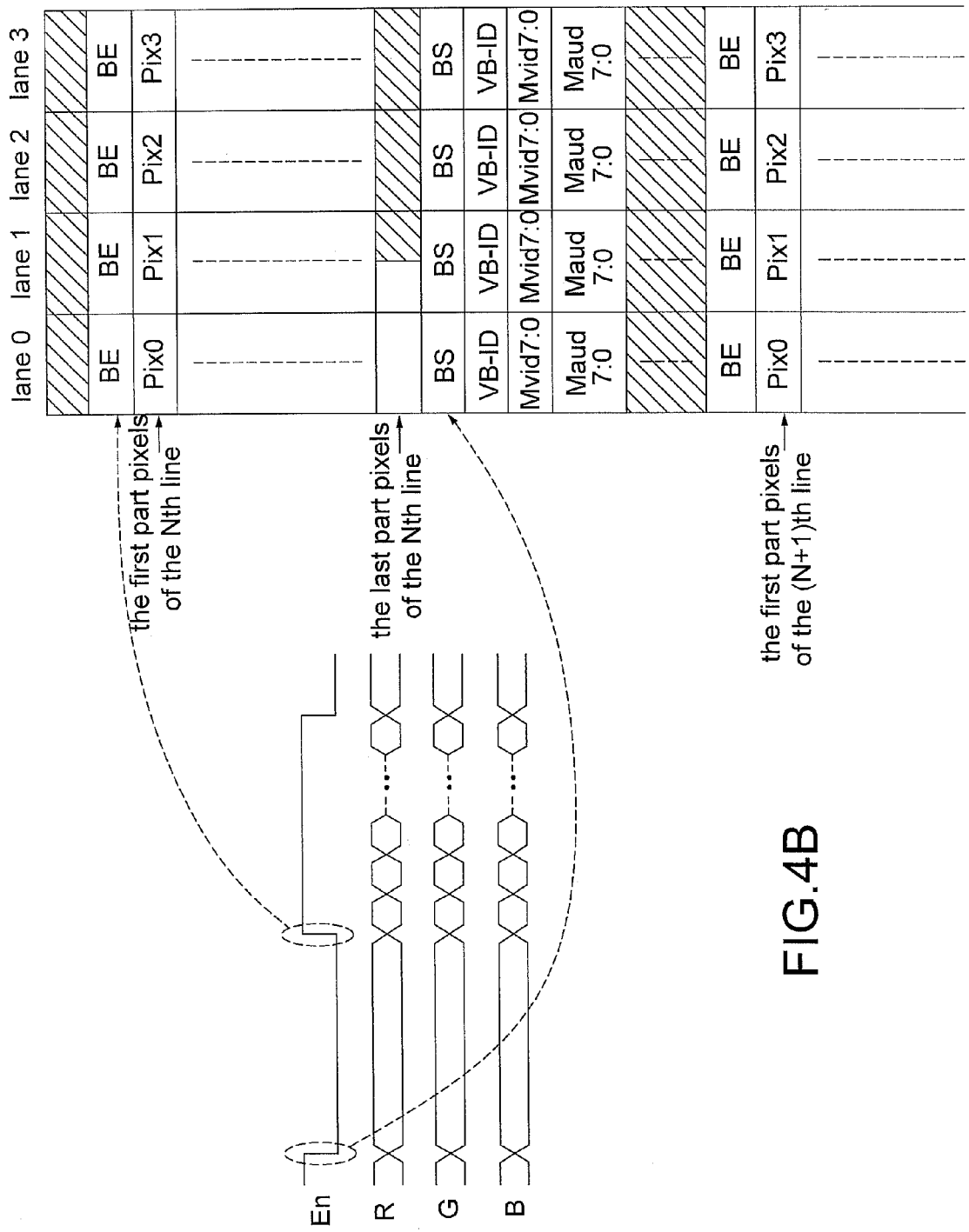
FIG. 4B shows a schematic diagram illustrating the transmitted data of the Displayport and the data packet after reorganizing data structure.
Figure 4C:
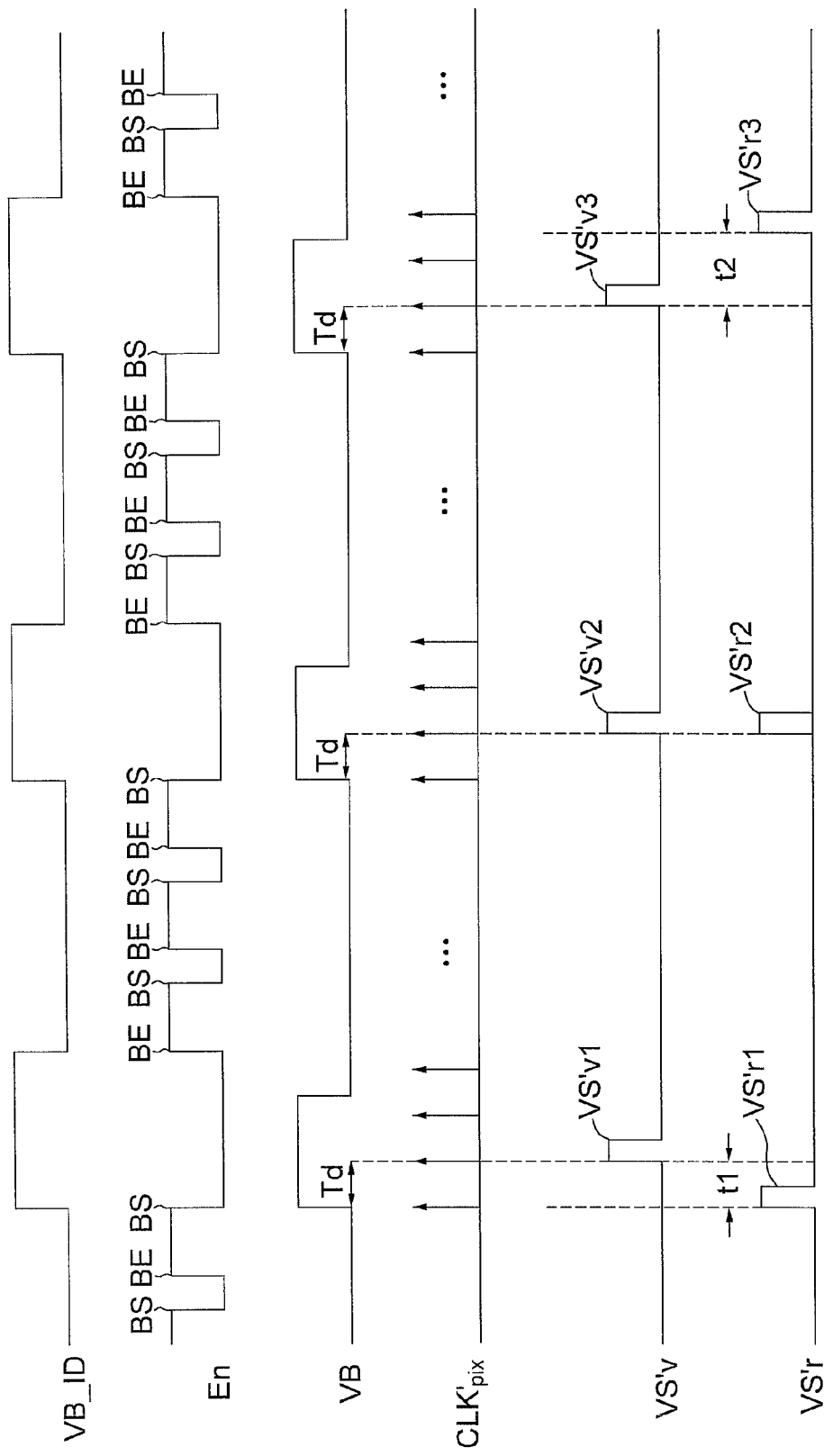
FIG. 4C shows a schematic diagram illustrating the relationship between the enable signal En, the control signal VB-ID, the vertical blanking signal VB, the recovered pixel clock $CLK'_{pix}$, and the vertical synchronizing signals VS'v and Vs'r.

As shown in FIG. 4B, when the source device 110 of the DisplayPort transmits data, the source device 110 re-arranges the data combination of the enable signal En, shown on the left-hand side of the drawing, the pixel data of the RGB three original colors, and so forth, and converts into the lane symbol transmission packet, shown on the right-hand side of the drawing, comprising four lanes. Lane 0, for example, at least comprises the blank start BS, the blank end BE, the control signal VB-ID, the video time stamp $M_{vid}$, the audio time stamp $M_{aud}$, and the pixel data. Referring to FIG. 4C, the sink device 320 solves the vertical blanking signal VB according to the VB-ID, the BS, and the BE in the packet. As shown in the drawing, the vertical blanking signal VB is 1, while VB-ID=1 and En=0. The vertical blanking signal VB is 0 during other time. It should be noted that the period of VB=1 indicates that the data transmitted by the source device 110 is in the vertical blanking period and the signal during the period of VB=1 is treated as the reference when adjusting a rate of the pixel clock signal $CLK'_{pix}$ in the embodiment of the invention.

Please refer to FIG. 4C. Firstly, the sink device 320 utilizes the time stamp $M_{vid}/N_{vid}$ to lock on an approximate pixel clock signal $CLK'_{pix}$. In addition, according to the DisplayPort specification, the vertical synchronizing signal VS'v in the sink device 320 must maintain a fixed timing relationship with the vertical blanking signal VB. For example, all the rising edges of the vertical synchronizing signal VS'v must lag behind the rising edges of the vertical blanking signal VB by a pre-determined time $T_d$ to prevent from missing the data or being unable to read the data. Therefore, the sink device 320 utilizes the VS' (for example, the VS'v2) that lag behind the VB by the pre-determined time $T_d$ as the new starting point for the pixel clock signal $CLK'_{pix}$, counts the "frame width*frame height ($H_{total}*V_{total}$)" of this frame by using the pixel clock signal $CLK'_{pix}$ based on this new starting point, and then constructs a second VS' (for example, the VS',v3) as the starting point of the pixel clock signal $CLK'_{pix}$ for counting the next frame. Thereafter, the process can be in the same manner as the above.

Theoretically, each of the vertical synchronizing signals should lag behind the VB by a pre-determined time $T_d$ and the vertical synchronizing signal having a delay time $T_d$ is generally called the virtual vertical synchronizing signal VS'v. However, in reality, because of the influences of the output jitter of the phase-locked loop 220, the offsets of the $M_{vid}$ or $M_{aud}$, circuits, or other environmental factors, the phase of the vertical synchronizing signal VS'r recovered by the sink device 320 may lead or lag the phase of the virtual vertical synchronizing signal VS'v and cannot lag behind the VB exactly for the pre-determined time $T_d$. For example, as shown in FIG. 4C, the VS'r1 leads the VS'v1 by time t1 and the VS'r3 lags the VS'v3 by time t2. The leading or lagging of the vertical synchronizing signal VS'r relative to the virtual vertical synchronizing signal VS'v reflects the influences of the plurality of external environmental factors on the pixel clock signal $CLK'_{pix}$ recovered by the sink device 320.

The structure of the embodiment of the invention utilizes the phase frequency detector PFD to detect the leading or lagging status of the phase deviation and measure the length of phase difference (so-called phase error) between the virtual vertical synchronizing signal VS'v and the recovered vertical synchronizing signal VS'r to generate at least one phase difference signal Pd (comprising phase leading data, phase lagging data or phase error data) for the clock generating unit 423 as the reference. Then, the clock generating unit 423 adjusts a rate of the pixel clock signal $CLK'_{pix}$ according to the phase difference signal Pd and/or the above-mentioned water level value WL to stabilize the data read-write rate of the video buffer 321 so that the sink device 320 is not interfered by the offset of the $M_{vid}$ or $M_{aud}$ or other environmental factors.

It should be noted that from other point of view the phase leading or lagging between the VS'v and the VS'r described by the structure of the embodiment of the invention means the length of phase difference between the vertical synchronizing signal VS'r and the vertical blanking signal VB. Furthermore, although the structure of the embodiment of the invention utilizes the phase difference data of the phase leading or lagging between the VS'v and the VS'r to increase or decrease a rate of the pixel clock signal $CLK'_{pix}$ so as to determine the rate of the pixel clock signal $CLK'_{pix}$ of the next frame so that the sink device 320 can correctly recover the image format to be the same as that transmitted by the source device 110. However, in another embodiment of the invention, the sink device 320 can also directly correct the vertical synchronizing signal VS'r so that the phase of the VS'r is aligned with the phase of the VS'v. Moreover, if the back-end circuit design can tolerate the incomplete last line phenomenon, the vertical synchronizing signal can also be generated automatically after the vertical blanking signal VB delays the predetermined time $T_d$. This is equal to utilizing the VS'v directly without using the complicated tracking structure as long as the initial estimated accuracy of the initial rate of pixel clock signal $CLK'_{pix}$ is limited within a tolerable range.

The technology of the above-mentioned clock generating units 323, 323', and 423 can be implemented by the phase-locked loop (PLL) or the direct digital synthesis (DDS) method.

Figure 5:
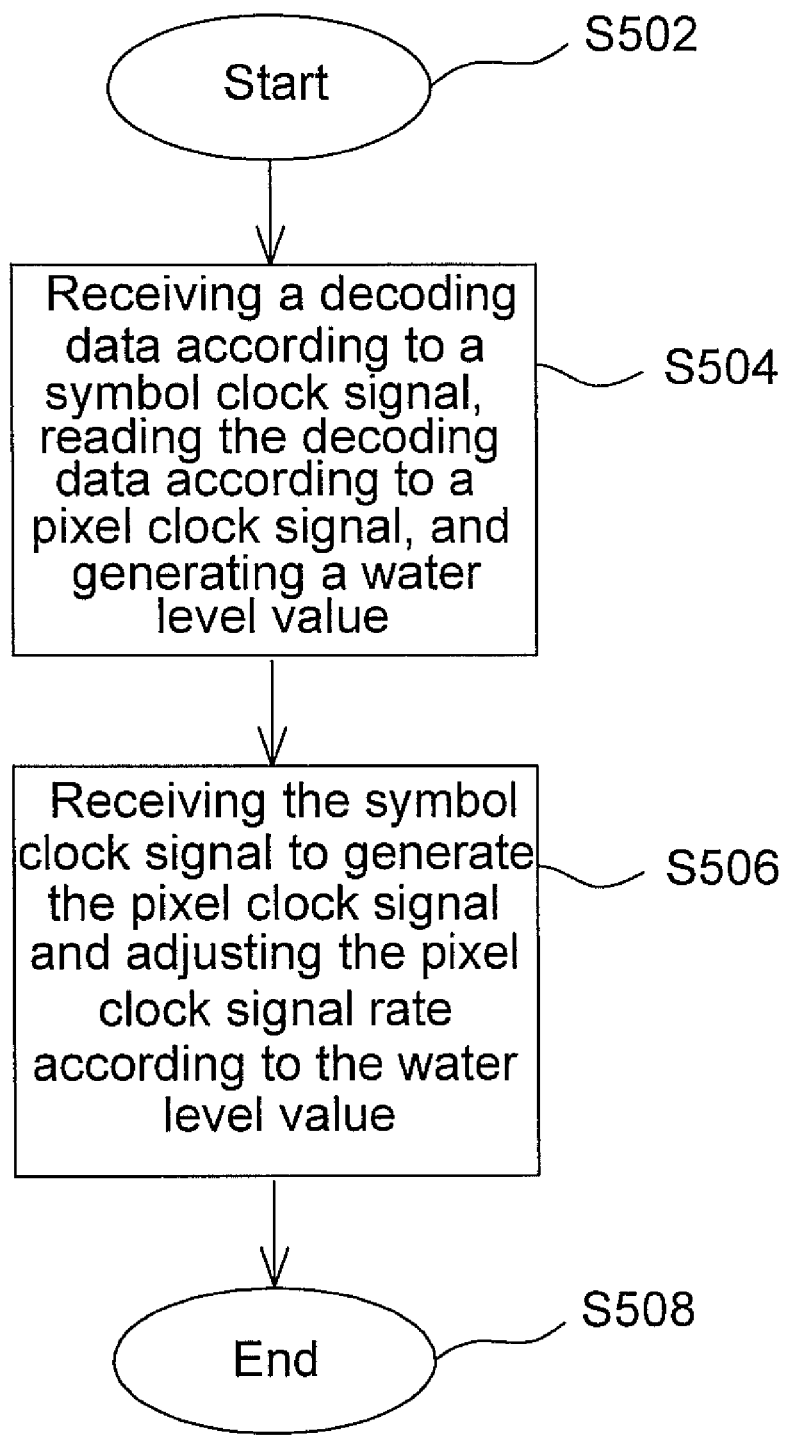
FIG. 5 shows a flowchart illustrating the clock signal rate calibrating method according to one embodiment of the invention.

FIG. 5 shows the flowchart of the clock signal rate calibrating method according to one embodiment of the invention. The method comprises the following steps:

Step S502: Start;

Step S504: Receiving a decoding data according to a symbol clock signal, reading the decoding data according to a pixel clock signal, and generating a water level value;

Step S506: Receiving the symbol clock signal to generate the pixel clock signal and adjusting a rate of the pixel clock signal according to the water level value;

Step S508: End.

It should be noted that the clock signal rate calibrating method according to one embodiment of the invention is applied in the link layer circuit of a sink device according to the DisplayPort specification, wherein the decoding data can be a video data or an audio data.

The step S504 of generating the water level value generates the water level value according to the difference of a write address of the decoding data and a read address of the decoding data. The step S506 of adjusting a rate of the pixel clock signal according to the water level value generates a control signal by determining whether the water level value is high or low and then adjusts a rate of the pixel clock signal according to the control signal.

The clock signal rate calibrating method according to another embodiment of the invention further comprises the following steps: detecting the phase difference data of a vertical synchronizing signal and a vertical blanking signal to generate at least one phase difference signal and adjusting a rate of the pixel clock signal according to the phase difference signal.

Furthermore, the clock signal rate calibrating method according to another embodiment of the invention further comprises the following steps: detecting the phase difference of a recovered vertical synchronizing signal and a virtual vertical synchronizing signal and adjusting a rate of the pixel clock signal according to the phase difference data of the recovered vertical synchronizing signal and the virtual vertical synchronizing signal. The phase of the virtual vertical synchronizing signal is mapping to a pre-determined timing point of a vertical blanking signal.

The specific examples described in the above is used to illustrate the technical content of the invention, but the invention is not limited to the above-mentioned embodiments. Various changes and modifications can be made without departing from the scope of the present invention.

What is claimed is:

1. A sink device, comprising:
    a buffering unit for receiving a decoding data according to a symbol clock signal, reading the decoding data according to a pixel clock signal, and generating a water level value;
    a clock generating unit for receiving the symbol clock signal to generate the pixel clock signal; and
    a phase detector for detecting a phase difference between a vertical synchronizing signal and a virtual vertical synchronizing signal to generate a phase difference signal;
    wherein the clock generating unit adjusts a rate of the pixel clock signal according to at least one of the phase difference signal and the water level value; and
    wherein the virtual vertical synchronizing signal lags a vertical blanking signal by a pre-determined time.

2. The sink device according to claim 1, wherein the sink device is applied in a link layer circuit of the sink device according to DisplayPort specification.

3. The sink device according to claim 1, wherein the buffering unit is a video buffering unit.

4. The sink device according to claim 1, wherein the buffering unit is an audio buffering unit.

5. The sink device according to claim 1, wherein the buffering unit generates the water level value according to a write address of the decoding data and a read address of the decoding data.

6. The sink device according to claim 5, wherein the buffering unit generates the water level value according to the difference between the write address of the decoding data and the read address of the decoding data.

7. The sink device according to claim 1, further comprising:
a determining unit to generate a control signal according to the water level value.

8. The sink device according to claim 7, wherein the clock generating unit receives the control signal and adjusts a rate of the pixel clock signal according to the control signal.

9. A sink device, comprising:
a buffering unit for receiving a decoding data according to a symbol clock signal, reading the decoding data according to a pixel clock signal, and generating a water level value;
a clock generating unit for receiving the symbol clock signal to generate the pixel clock signal; and
a phase detector for detecting phase difference data of a vertical synchronizing signal and a vertical blanking signal to generate at least one phase difference signal;
wherein the clock generating unit adjusts a rate of the pixel clock signal according to at least one of the phase difference signal and the water level value.

10. The sink device according to claim 1, wherein the clock generating unit is a phase-locked loop.

11. The sink device according to claim 1, wherein the clock generating unit is a direct digital synthesis device.

12. A clock signal rate calibrating method, comprising:
receiving a decoding data according to a symbol clock signal, reading the decoding data according to a pixel clock signal, and generating a water level value;
receiving the symbol clock signal to generate the pixel clock signal;
detecting a phase difference between a recovered vertical synchronizing signal and a virtual vertical synchronizing signal to generate a phase difference signal; and
adjusting a rate of the pixel clock signal according to at least one of the phase difference signal and the water level value;
wherein the virtual vertical synchronizing signal lags a vertical blanking signal by a pre-determined time.

13. The clock signal rate calibrating method according to claim 12, wherein the steps for generating the water level value further comprises:
generating the water level value according to a write address of the decoding data and a read address of the decoding data.

14. The clock signal rate calibrating method according to claim 13, wherein the steps for generating the water level value further comprises:
generating the water level value according to the difference between the write address of the decoding data and the read address of the decoding data.

15. The clock signal rate calibrating method according to claim 12, further comprising:
generating a control signal according to the water level value; and
adjusting a rate of the pixel clock signal according to the control signal.

16. A clock signal rate calibrating method, comprising:
receiving a decoding data according to a symbol clock signal, reading the decoding data according to a pixel clock signal, and generating a water level value;
receiving the symbol clock signal to generate the pixel clock signal;
detecting phase difference data between a vertical synchronizing signal and a vertical blanking signal to generate at least one phase difference signal; and
adjusting a rate of the pixel clock signal according to at least one of the water level value and the phase difference signal.

* * * * *